US011404365B2

(12) United States Patent
Arvin et al.

(10) Patent No.: US 11,404,365 B2
(45) Date of Patent: Aug. 2, 2022

(54) DIRECT ATTACHMENT OF CAPACITORS TO FLIP CHIP DIES

(71) Applicant: International Business Machines Corporation, Armonk, NY (US)

(72) Inventors: Charles L. Arvin, Poughkeepsie, NY (US); Bhupender Singh, Fishkill, NY (US); Mark Kapfhammer, Poughkeepsie, NY (US); Brian W. Quinlan, Poughkeepsie, NY (US); Sylvain Pharand, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/405,977

(22) Filed: May 7, 2019

(65) Prior Publication Data
US 2020/0357737 A1 Nov. 12, 2020

(51) Int. Cl.
*H01L 21/02* (2006.01)
*H01L 23/522* (2006.01)
*H01L 23/00* (2006.01)

(52) U.S. Cl.
CPC .......... *H01L 23/5223* (2013.01); *H01L 24/09* (2013.01); *H01L 24/17* (2013.01); *H01L 2924/0105* (2013.01); *H01L 2924/01029* (2013.01); *H01L 2924/01047* (2013.01); *H01L 2924/01049* (2013.01); *H01L 2924/01079* (2013.01); *H01L 2924/01082* (2013.01); *H01L 2924/01083* (2013.01)

(58) Field of Classification Search
CPC ..... H01L 23/5223; H01L 24/09; H01L 24/17; H01L 2924/01083; H01L 2924/01049; H01L 2924/01029; H01L 2924/01082; H01L 2924/01047; H01L 2924/01079; H01L 2924/0105
See application file for complete search history.

(56) References Cited

U.S. PATENT DOCUMENTS

| 5,249,098 | A |  | 9/1993 | Rostoker et al. |
|---|---|---|---|---|
| 5,504,373 | A | * | 4/1996 | Oh .......................... G11C 29/88 257/734 |
| 5,784,261 | A | * | 7/1998 | Pedder .................. H01L 21/563 257/737 |
| 5,939,783 | A | * | 8/1999 | Laine .................... H01L 23/142 257/702 |
| 6,335,566 | B1 |  | 1/2002 | Hirashima et al. |

(Continued)

FOREIGN PATENT DOCUMENTS

KR 20000008455 A 2/2000

*Primary Examiner* — Ismail A Muse
(74) *Attorney, Agent, or Firm* — L. Jeffrey Kelly; Otterstedt, Wallace & Kammer, LLP

(57) ABSTRACT

An integrated circuit package includes a substrate, a flip chip die, and a capacitor. The flip chip die is attached to the substrate via die-to-substrate interconnects. The capacitor is attached to the flip chip die via capacitor-to-die interconnects so that the capacitor occupies a region between the flip chip die and the substrate. Such placement of the capacitor on a flip chip die has the advantage of reducing the distance between the capacitor and its core, thereby reducing unwanted line inductance and series resistance effects. Integrated circuit performance is thereby enhanced.

8 Claims, 5 Drawing Sheets

(56) References Cited

U.S. PATENT DOCUMENTS

| | | | |
|---|---|---|---|
| 6,515,370 B2* | 2/2003 | Hashimoto | H01L 23/562 257/777 |
| 6,873,035 B2* | 3/2005 | Watanabe | H01L 23/49816 257/686 |
| 6,884,939 B2* | 4/2005 | Dishongh | H01L 23/50 174/534 |
| 6,946,321 B1 | 9/2005 | Yegnashankaran et al. | |
| 7,133,294 B2* | 11/2006 | Patel | H01L 24/81 361/782 |
| 7,214,565 B2* | 5/2007 | Sunohara | H01L 24/19 438/108 |
| 7,319,268 B2 | 1/2008 | Watanabe et al. | |
| 7,378,898 B2 | 5/2008 | Nair | |
| 7,402,900 B2* | 7/2008 | Ooi | H01L 21/4857 257/684 |
| 7,443,036 B2* | 10/2008 | Iwasaki | H01L 21/563 257/777 |
| 7,705,450 B2 | 4/2010 | Vinson et al. | |
| 8,035,216 B2 | 10/2011 | Skeete | |
| 8,179,689 B2* | 5/2012 | Mashino | H01L 24/16 361/763 |
| 9,462,691 B1* | 10/2016 | Xie | H01L 24/06 |
| 10,622,299 B2* | 4/2020 | Arvin | H01L 23/5223 |
| 2001/0003656 A1* | 6/2001 | Funaya | H05K 3/284 438/1 |
| 2002/0042164 A1* | 4/2002 | Funaya | H01L 23/49811 438/125 |
| 2004/0012085 A1* | 1/2004 | Shioga | H01L 27/016 257/723 |
| 2004/0067605 A1* | 4/2004 | Koizumi | H01L 21/563 438/108 |
| 2004/0184219 A1* | 9/2004 | Otsuka | H01L 23/49816 361/306.3 |
| 2004/0239349 A1* | 12/2004 | Yamagishi | G01R 31/2886 324/754.07 |
| 2005/0151252 A1* | 7/2005 | Watanabe | H01L 25/0657 257/738 |
| 2005/0179128 A1* | 8/2005 | Shioga | H01L 23/50 257/724 |
| 2005/0199991 A1* | 9/2005 | Chao | H01L 25/0652 257/686 |
| 2005/0218516 A1* | 10/2005 | Lloyd | H01L 23/62 257/738 |
| 2006/0157792 A1* | 7/2006 | Konushi | H01G 4/306 257/359 |
| 2006/0255816 A1* | 11/2006 | Shioga | G01R 1/07378 361/271 |
| 2006/0255817 A1* | 11/2006 | Yamagishi | G01R 1/07378 324/754.07 |
| 2007/0054419 A1* | 3/2007 | Paik | H01L 27/14687 438/1 |
| 2007/0141750 A1* | 6/2007 | Iwasaki | H01L 24/13 438/108 |
| 2007/0289384 A1* | 12/2007 | Sakai | G01P 15/125 73/514.32 |
| 2009/0008777 A1* | 1/2009 | Lin | H01L 24/82 257/738 |
| 2009/0162622 A1* | 6/2009 | Van Veen | H05K 1/14 428/198 |
| 2009/0283903 A1* | 11/2009 | Park | H01L 24/05 257/737 |
| 2010/0123215 A1* | 5/2010 | Pan | H01L 25/105 257/532 |
| 2010/0214751 A1* | 8/2010 | Aoki | H01L 25/105 361/772 |
| 2012/0098126 A1* | 4/2012 | Iwasaki | H01L 24/11 257/737 |
| 2014/0103117 A1* | 4/2014 | Takeuchi | G06K 19/07786 235/492 |
| 2014/0140027 A1* | 5/2014 | Enriquez Shibayama | H05K 1/0228 361/773 |
| 2014/0252544 A1* | 9/2014 | Li | H01L 23/50 257/532 |
| 2015/0098677 A1* | 4/2015 | Thacker | G02B 6/428 385/14 |
| 2015/0228606 A1* | 8/2015 | Chen | H01L 23/3107 257/782 |
| 2015/0294791 A1* | 10/2015 | Hwang | H01G 4/1227 174/260 |
| 2016/0126695 A1* | 5/2016 | Gambino | H01L 24/14 372/43.01 |
| 2016/0351504 A1* | 12/2016 | Teshima | H01L 23/50 |
| 2016/0365328 A1* | 12/2016 | Graf | H01L 25/0657 |
| 2017/0125973 A1* | 5/2017 | Gambino | H01L 24/13 |
| 2017/0125974 A1* | 5/2017 | Gambino | H01L 24/11 |
| 2017/0170133 A1* | 6/2017 | Audet | H01L 24/19 |
| 2017/0170134 A1* | 6/2017 | Audet | H01L 28/40 |
| 2017/0256489 A1* | 9/2017 | Zhai | H01L 23/528 |
| 2017/0287853 A1* | 10/2017 | Kim | H01L 23/49822 |
| 2018/0012838 A1* | 1/2018 | Arvin | H01L 24/17 |
| 2018/0041003 A1* | 2/2018 | Dominguez | H01L 24/17 |
| 2018/0053717 A1* | 2/2018 | Arvin | H01L 23/49822 |
| 2018/0068945 A1* | 3/2018 | Arvin | H01L 23/49822 |
| 2019/0006334 A1* | 1/2019 | Gardner | H01L 23/49816 |
| 2019/0244926 A1* | 8/2019 | Graf | H01L 25/50 |
| 2019/0304901 A1* | 10/2019 | Hwang | H01L 23/3128 |
| 2019/0393297 A1* | 12/2019 | Kung | H01L 25/105 |
| 2020/0014171 A1* | 1/2020 | Gambino | H01L 24/11 |
| 2020/0043821 A1* | 2/2020 | Choi | H05K 3/3484 |
| 2020/0185156 A1* | 6/2020 | Arvin | H01G 4/228 |
| 2020/0212020 A1* | 7/2020 | Zhang | H01L 21/563 |
| 2020/0212536 A1* | 7/2020 | Gupta | H01L 21/6835 |
| 2021/0013151 A1* | 1/2021 | Yu | H01L 23/5226 |

* cited by examiner

DIRECT ATTACHMENT OF CAPACITORS TO FLIP CHIP DIES

BACKGROUND

The present invention relates to the electrical, electronic, and computer arts, and, more particularly, to integrated circuit packages with capacitors directly attached to flip chip dies.

Capacitors are frequently paired with microprocessor cores in integrated circuit (IC) packages to provide decoupling and diminish the effects of mid-frequency noise. In this case, mid-frequency noise includes those frequencies typically between 1 and 500 megahertz (MHz). It is not uncommon, for example, to find packages with processor dies that are virtually surrounded by arrays of capacitors.

Generally, it is advantageous to place capacitors as close to a microprocessor core as possible because close placement reduces the amount of line inductance and series resistance between these elements. Simulations suggest, for example, that for every one-millimeter reduction in distance between a capacitor and a microprocessor core, there may be about a seven millivolt reduction in mid-frequency noise droop. Every ten-millivolt (mV) reduction in droop, in turn, may yield an additional one-percent improvement in performance as mid-frequency noise is the limiting performance gain for high end modules that can be addressed by top surface mount (TSM) capacitors. As signal frequency increases, so too do the needs for decoupling capacitors to address the noise. These decoupling needs are now approaching one gigahertz (GHz) to ten terahertz (THz). The Equivalent Series Inductance (ESL) of the path needs to typically be less than one picohenries (pH) and the Equivalent Series Resistance (ESR) needs to typically drop below ten milliohms (me), requiring many parallel connections between the capacitor and the processor.

Flip chip dies are used in the mass production of high-end devices such as microprocessors and graphic chips. In a typical flip chip technology, the underside of a flip chip die is attached to a substrate (sometimes called an interposer) via a matrix of solder bumps that form solder interconnects with the substrate. In a flip chip ball grid array (FC-BGA) package, the die/substrate combination may then be connected to a third element (frequently a printed circuit board) via a set of solder balls on the surface of the substrate opposite to that facing the flip chip die.

There is, as a result, a need for new approaches for implementing capacitors with flip chip dies that allows extremely close placement of the capacitors to the flip chip dies.

SUMMARY

Embodiments of the invention describe the attachment of a capacitor directly to the underside of a flip chip die so that the capacitor occupies a space between the flip chip die and a substrate. Such placement has the advantage of reducing the distance between the capacitor and its microprocessor core, thereby reducing unwanted line inductance and series resistance effects.

Aspects of the invention are directed to an integrated circuit package comprising a substrate, a flip chip die, and a capacitor. The flip chip die is attached to the substrate via a plurality of die-to-substrate interconnects. The capacitor is attached to the flip chip die via a plurality of capacitor-to-die interconnects and occupies a region between the flip chip die and the substrate.

Additional aspects of the invention are directed to a method of forming an integrated circuit package. A capacitor is attached to a flip chip die via a plurality of capacitor-to-die interconnects. The flip chip die is attached to a substrate via a plurality of die-to-substrate interconnects. The capacitor occupies a region between the flip chip die and the substrate.

Even additional aspects of the invention are directed to an apparatus comprising a substrate, a flip chip die, and a capacitor. The flip chip die is attached to the substrate via a plurality of die-to-substrate interconnects. The capacitor is attached to the flip chip die via a plurality of capacitor-to-die interconnects and occupies a region between the flip chip die and the substrate.

BRIEF DESCRIPTION OF THE DRAWINGS

These and other features, aspects, and advantages of the present invention will become better understood with regard to the following description, appended claims, and accompanying drawings where:

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein and in the appended claims, the term "directly" means without any intervening elements.

Embodiments in accordance with aspects of the invention describe flip-chip-based IC packages wherein one or more capacitors are attached to the bottom of a flip chip die so that the capacitors occupy the space between the flip chip die and its substrate. Attachment of the capacitors to the flip chip die in this manner has the advantage of allowing the capacitors to provide decoupling and noise-filtering functions while, at the same time, minimizing unwanted line inductances and series resistances associated with capacitors that are farther spaced from their microprocessor cores. IC performance is thereby optimized.

Figure 1:
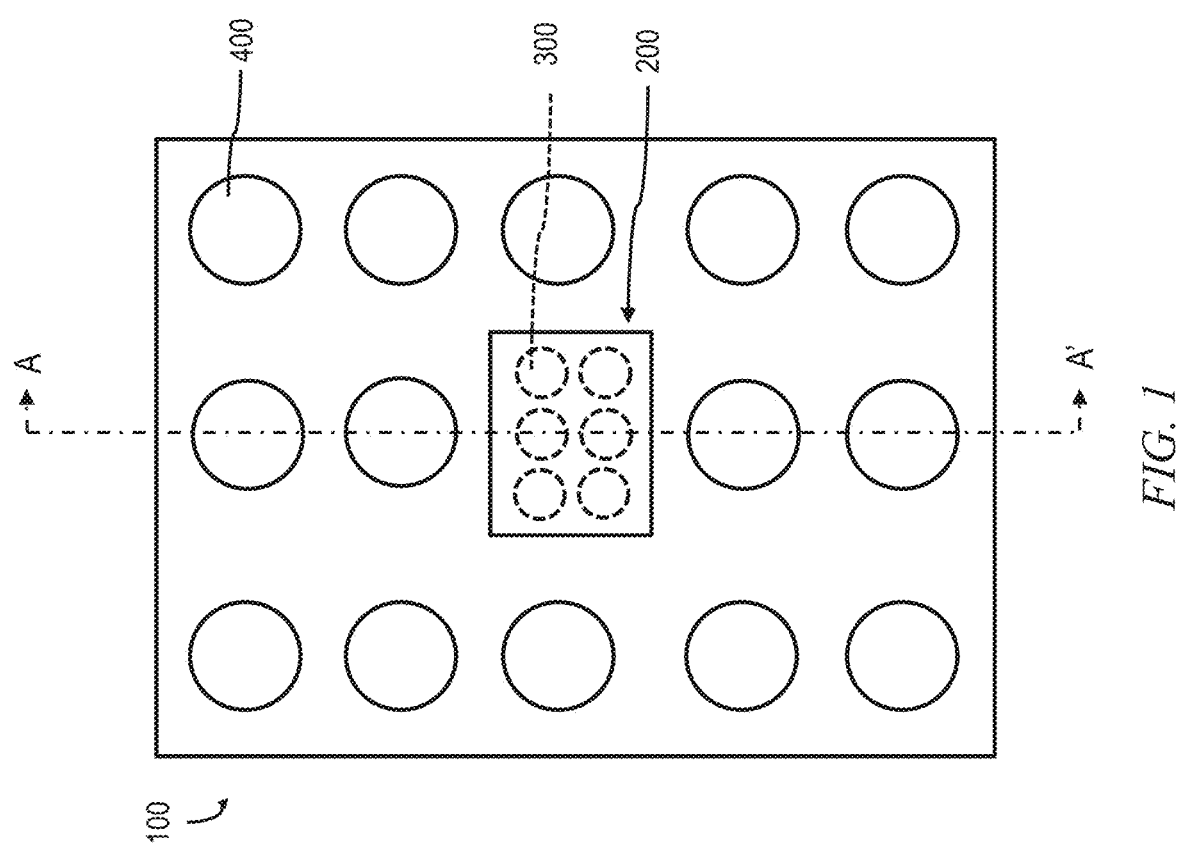
FIG. 1 is a bottom elevational view of a flip chip die and a capacitor, in accordance with an illustrative embodiment of the invention.

FIG. 1 shows a bottom elevational view of an illustrative flip chip die 100 and an illustrative capacitor 200 in accordance with aspects of the invention. The capacitor 200 is attached to the bottom of the flip chip die 100 via a plurality of capacitor-to-die interconnects 300, which are shown in phantom because they occupy the space between the capacitor 200 and the flip chip die 100. The flip chip die 100 includes die-to-substrate interconnects 400 for subsequent attachment to a substrate (not shown). With the flip chip die 100 attached to the substrate, the capacitor 200 occupies the space between the flip chip die 100 and the substrate.

There are several ways of attaching the capacitor 200 to the flip chip die 100, and subsequently attaching the flip chip die 100 (with the capacitor 200) to a substrate. One such example is shown in FIGS. 2A and 2B, with FIG. 2A showing a sectional view of the flip chip die 100 and the capacitor 200 attached to a substrate 500 along the A-A' cleave plane in FIG. 1, and FIG. 2B showing a magnified sectional view of a region of the flip chip die 100 and the capacitor 200 before capacitor attachment.

Figure 2A:
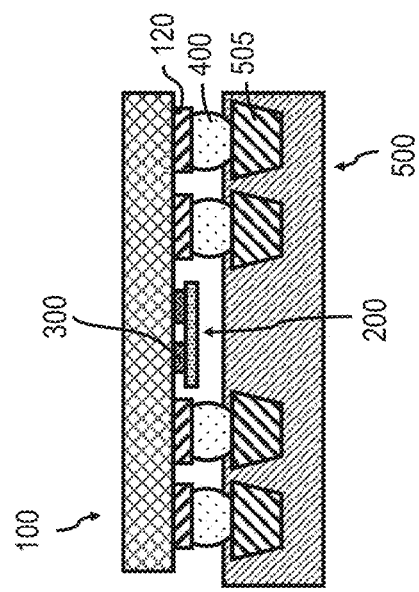
FIG. 2A shows a sectional view of the FIG. 1 flip chip die and capacitor attached to a substrate, in accordance with an illustrative embodiment of the invention.
Figure 2B:
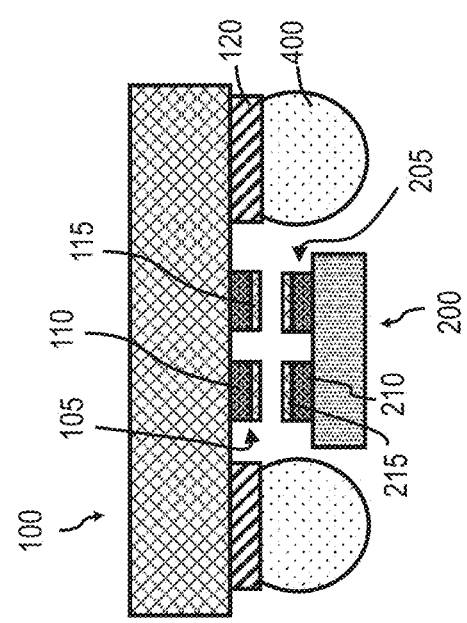
FIG. 2B shows a magnified sectional view of a region of the FIG. 2A flip chip die and capacitor before capacitor attachment.

In the embodiment shown in FIGS. 2A and 2B, each of the capacitor-to-die interconnects 300 are formed of a combination of a respective capacitor stack 205 and a respective die stack 105 that are brought together and merge during a reflow process to form a unitary capacitor-to-die interconnect 300. In one or more embodiments, for example, the capacitor stacks 205 may each comprise a respective lower capacitor layer 210 comprising Ni topped with a respective upper capacitor layer 215 comprising Sn before joining (FIG. 2B). Each of the die stacks 105 may comprise a respective lower die layer 110, also comprising Ni, topped with a respective upper die layer 115 comprising Au before joining (FIG. 2B).

The die-to-substrate interconnects 400, in turn, attach to and interconnect die pads 120 on the flip chip die 100 to substrate pads 505 on the substrate 500 (FIG. 2A). In one or more embodiments, the die-to-substrate interconnects 400 may comprise solder bumps formed of, for example, SnBi (e.g., 42 wt % Sn; 58 wt % Bi) or PbSn (e.g., eutectic 37 wt % Pb; 63 wt % Sn). The die pads 120 may comprise, as just a few examples, Cr—Cr:Cu—Cu—Au; Ti—Cu; Ti:W—Cu; Ti—Ni—:V, Cr—Cr:Cu—Cu; Al—Ni: V—Cu; or Ti:W (N)—Au, in accordance with conventional "under-bump metallization" (UBM). The substrate pads 505 may comprise, for instance, Cu, NiAu, NiAuPd, or some combination thereof.

As will be further discussed below, it is contemplated that the capacitor 200 will be attached to the flip chip die 100 before the flip chip die 100 is attached to the substrate 500 (i.e., before die attach). As a result, it is preferred that the capacitor-to-die interconnects 300 not reflow during the thermal processing required for die attach. Stated another way, the ultimate melting point temperature of the capacitor-to-die interconnects 300 will preferably be higher than the reflow temperature of the die-to-substrate interconnects 400. Otherwise, the capacitor-to-die interconnects 300 may melt during die attach and be compromised.

Where the upper capacitor layers 215 comprise Sn and the upper die layers 115 comprise Au, as in the example presented above, the capacitor-to-die interconnects 300 may be formed by bringing the capacitor stacks 205 into contact with their corresponding die stacks 105 and heating the combination to about 250° C. This will have the effect of melting the Sn (with a pure Sn melting point temperature of about 232° C.) and gettering the Au into the molten Sn to form an SnAu bonding layer by what is sometimes called a "moving boundary" effect. Once cooled and solidified, the just-formed SnAu bonding layer will have a melting point temperature of some 280° C. assuming about 20 wt % Sn. This melting point is about 60° C. higher than the reflow temperature of 217° C. typically used to reflow SAC (Sn—Ag—Cu) solder bumps. A 50+° C. temperature difference between the melting point temperature of the capacitor-to-die interconnects 300 and the reflow temperature of the die-to-substrate interconnects 400 (hereinafter called the "temperature delta") is considered more than sufficient. In fact, where very precise heating means are utilized for subsequent die attach, substantially smaller temperatures deltas (e.g., 10° C. or less) may be entirely adequate. Such precision may be obtained utilizing conventional methods and tooling including, for example, some thermal compression bonding machines.

In another embodiment, as just another example, the capacitor stacks 205 and the die stacks 105 may be similarly composed to one another, with the lower capacitor layers 210 and the lower die layers 110 comprising Cu, and the upper capacitor layers 215 and the upper die layers 115 comprising SnAg (e.g., 96.5 wt % Sn; 3.5 wt % Ag). Once brought together, reflow can be performed at about 250° C. The resulting SnAg bonding layer will then solidify with a melting point temperature of about 220° C. So long as the die attach is performed at temperatures lower than this, there should be no issue with the capacitor-to-die interconnects 300 melting or otherwise deforming during the subsequent processing. Eutectic SnBi has a melting point temperature of about 139° C., allowing reflows to be performed at under 150° C. if desired, and making this choice of solder a good choice in many embodiments of the present invention. A temperature delta of greater than 20° C. may thereby be obtained utilizing higher melting point solders such as SnAg for the capacitor-to-die interconnects 300 and lower melting point solders such as Sn—Bi40—Cu0.5—Ni0.03 that also melt at 139° C. for the die-to-substrate interconnects 400. Other candidate solders for the capacitor-to-die interconnects 300 may include 95.5Sn3.9Ag0.6Cu and 97Sn3Cu, which have melting point temperatures around 220° C. and 230° C., respectively. Nevertheless, this list is not meant to be exhaustive and any other suitable materials would still come within the scope of the invention.

Two candidate capacitor types for the capacitor 200 are silicon deep trench (Si DT) capacitors and metal-insulator-metal (MIM) capacitors. A combination of these types of capacitors may also be utilized. Both Si DT and MIM capacitors will already be familiar to one having ordinary skill in the relevant arts. Si DT capacitors utilize silicon substrates that house an array of deep trench capacitors patterned into the body of the capacitor. MIM capacitors utilize metal plates separated by dielectric materials. In the present embodiment, the illustrative capacitor 200 is shown with six capacitor-to-die interconnects 300 (FIG. 1), but this number is merely by way of illustration. In actual reduction to practice, fewer or greater numbers of capacitor-to-die interconnects 300 may be utilized.

Given that the capacitor 200 will occupy the space between the flip chip die 100 and the substrate 500, the combined height of the capacitor 200 and the capacitor-to-die interconnects 300 is preferably smaller than the combined height of the die pads 120 and the die-to-substrate interconnects 400 so as to avoid interference. To accommodate this limitation, each of the capacitor-to-die interconnects 300 preferably has a height smaller than that of each of the die-to-substrate interconnects 400. In some cases, the capacitor 200 may also have to be thinner than those utilized in other decoupling roles. Capacitors with 30-50 micrometer (μm) thicknesses may, for example, be utilized. Both modern Si DT capacitors and MIM capacitors may demonstrate capacitance densities of up to three microfarads per square millimeter ($\mu F/mm^2$), giving even thinned capacitors adequate capacitances to provide the desired decoupling and filtering functions.

Figure 3:
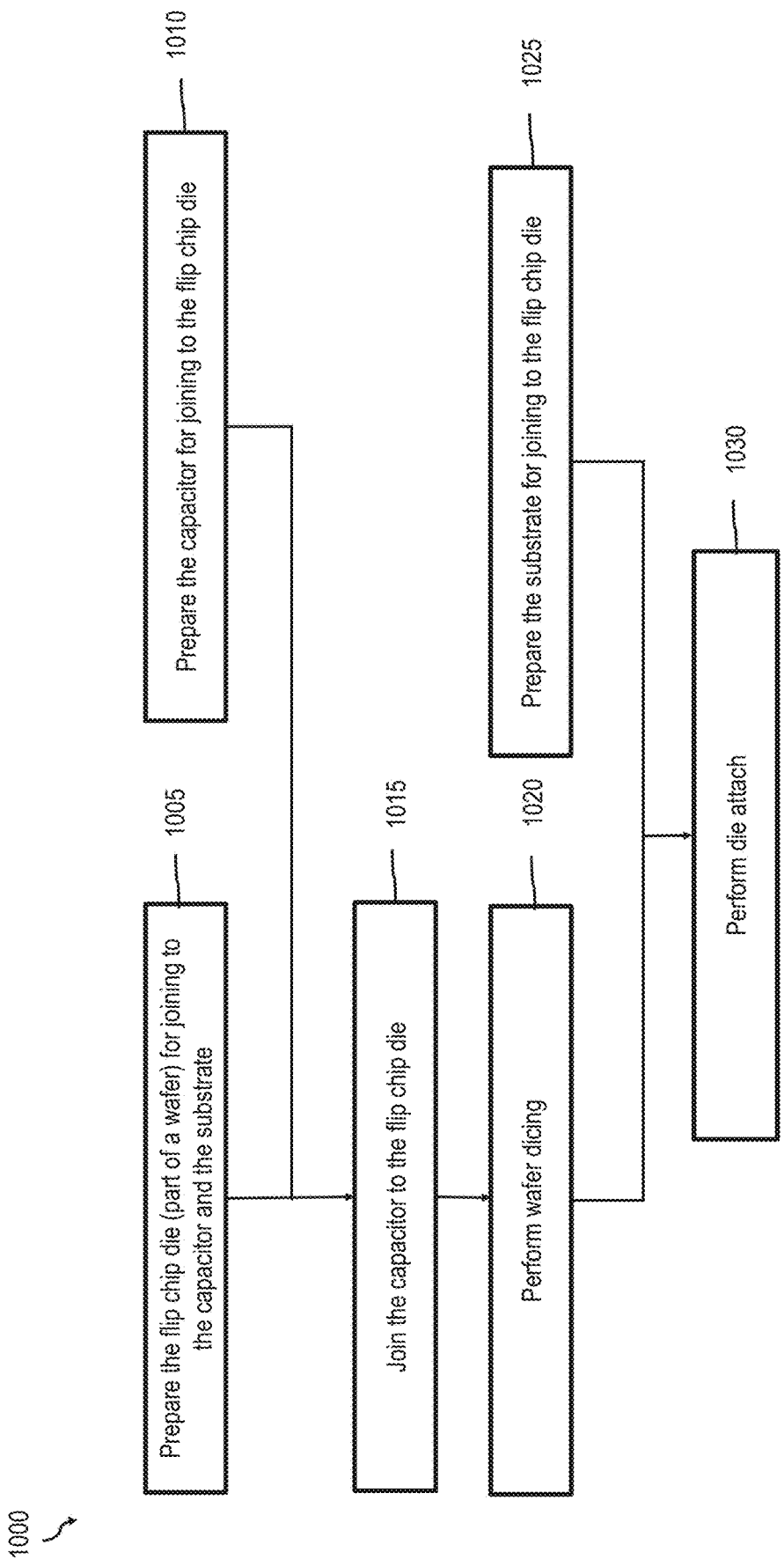
FIG. 3 shows a flow diagram of an illustrative method for forming the FIG. 2A combination.

FIG. 3 shows a flow diagram of an illustrative method 1000 for forming the combination of the flip chip die 100, the capacitor 200, and the substrate 500 in FIGS. 2A and 2B. In presenting this method 1000, however, it should be recognized that while the structures provided herein are entirely novel, many of the individual processing steps required to implement the method may utilize conventional semiconductor fabrication and packaging techniques, as well as conventional tooling. These techniques and tooling will already be familiar to one having ordinary skill in the relevant arts. Moreover, details of the individual processing steps used to fabricate semiconductor and to package devices described herein may be found in a number of publications including, for example, P. V. Zant, *Microchip Fabrication, Sixth Edition: A Practical Guide to Semiconductor Processing*, McGraw Hill Professional, 2013; S. Wolf, *Silicon Processing for the VLSI Era*, Vol. 4: *Deep-Submicron Process Technology*, Lattice Press, 2003; and H. Geng, *Semiconductor Manufacturing Handbook, Second Edition*, McGraw Hill Education, 2018, each of which are incorporated by reference herein. It is also emphasized that the descriptions provided herein are not intended to encompass all of the processing steps that may be required to successfully form a functional device. Rather, certain processing steps that are conventionally used in forming packaged integrated circuit devices are purposefully not described herein for economy of description. However, one skilled in the art will readily recognize those processing steps omitted from this more generalized description.

In the method 1000, the flip chip die 100 is prepared for joining to the capacitor in step 1005 while the flip chip 100 is still part of a larger, intact wafer (i.e., at wafer level). The die stacks 105 may be formed on the flip chip die 100 by, for example, coating the wafer in resist, and then exposing and developing the resist to create openings in the resist over those regions where the die stacks 105 are intended. Electroplating may then be utilized to form the die stacks 105 with the lower and upper die layers 110, 115 in these openings. The resist may then be stripped.

The die pads 120 and the die-to-substrate interconnects 400 may be formed on the flip chip die 100 by standard solder bumping techniques. In one or more embodiments, for example, a "mushroom" solder bumping process may be utilized. A UBM layer for the die pads 120 may be deposited by sputtering, and a resist coated and developed on this layer with openings where the die pads 120 and solder bumps are intended. Solder bumps may then be electroplated onto the UBM layer through the openings in the resist, and the resist stripped to create mushroom shaped solder features. The UBM layer may then be etched using the mushroom-shaped solder bumps as a hard mask to define the die pads 120, and the solder bumps reflowed to create the spherical die-to-substrate interconnects 400 (i.e., spherical solder bumps) visible in FIG. 2B.

In an alternative process, a "photo stencil" process may be utilized to form the die pads 120 and the die-to-substrate interconnects 400, wherein a UBM layer is deposited by sputtering and patterned into the die pads 120 by photolithography and etching. A dry film resist may then be coated, exposed, and developed on the film stack to create openings over the die pads 120. Solder past may then be deposited into the openings, the dry resist stripped, and the solder paste reflowed to again create the spherical die-to-substrate interconnects 400 (i.e., spherical solder bumps) visible in FIG. 2B. It is noted, however, that while mushroom- and photo-stencil-based bumping techniques are explicitly described above, any other suitable techniques would also fall within the scope of the invention. These alternative techniques include, but are not limited to, stud bumping, solder jetting, evaporation, and electroless bumping.

Step 1010 involves preparing the capacitor 200 for joining to the flip chip die 100. Preparation of the capacitor stacks 205 on the capacitor 200 in step 1010 may be by a process similar to that used to prepare the die stacks 105 on the flip chip die 100 in step 1005. That is, a process flow comprising resist deposition and exposure, electroplating, and resist stripping may be utilized (see above).

With the flip chip die 100 and the capacitor 200 prepared in this manner, the capacitor 200 may be joined to the flip chip die 100, again, with the flip chip die 100 still part of the wafer. Step 1015 may be performed before wafer level testing or afterwards, as desired. To accomplish the attachment, the capacitor stacks 205 may be brought into contact with the die stacks 105 and heat applied to the upper die layers 115 and the upper capacitor layers 215. The choice of materials for the upper die and capacitor layers 115, 215 will dictate the necessary temperature. During this process, the die-to-substrate interconnects 400 (i.e., solder bumps) may melt and re-solidify. Nevertheless, studies have shown minimal impact on solder bump integrity even after a solder bump has been reflowed some ten times. Moreover, the spaces between the components is preferably adequate to keep any molten die-to-substrate interconnects 400 sufficiently apart from the capacitor 200. The sidewalls of the capacitor 200 are also preferably not wettable.

In step 1020, the wafer containing the flip chip die 100 may be diced to create individual flip chip die, including the flip chip die 100. In step 1025, the substrate 500 is prepared for joining to the flip chip die 100. In some embodiments, for example, the substrate pads 505 may be topped with a pre-solder layer comprising a solder similar to that used for the die-to-substrate interconnects 400 (i.e., the solder bumps). In other embodiments, where, for example, the substrate pads 505 comprise NiAu or NiPdAu, it may be possible to forego the pre-solder layer. If pre-solder is utilized, deposition of the pre-solder may be by electroplating at the same time the underlying substrate pads 505 are formed. The pre-solder may be reflowed after deposition.

Attachment of the flip chip die 100 to the substrate 500 occurs in step 1030. A layer of flux may be deposited on the substrate 500 before bringing the die-to-substrate interconnects 400 into contact with the substrate pads 505 (and any pre-solder) and heating to reflow the die-to-substrate interconnects 400. Subsequently, the combination in FIG. 2A may be underfilled to strengthen the attachments of the various components.

In this manner, an IC package is formed comprising a substrate (e.g., the substrate 500), a flip chip die (e.g., the flip chip die 100), and a capacitor (e.g., the capacitor 200). The flip chip die is attached to the substrate via a plurality of die-to-substrate interconnects (e.g., die-to-substrate interconnects 400). The capacitor is attached to the flip chip die via a plurality of capacitor-to-die interconnects (e.g., capacitor-to-die interconnects 300) and occupies a region between the flip chip die and the substrate (e.g., the capacitor 200 occupies a region between the flip chip die 100 and the substrate 500 in FIG. 2A).

Figure 4A:
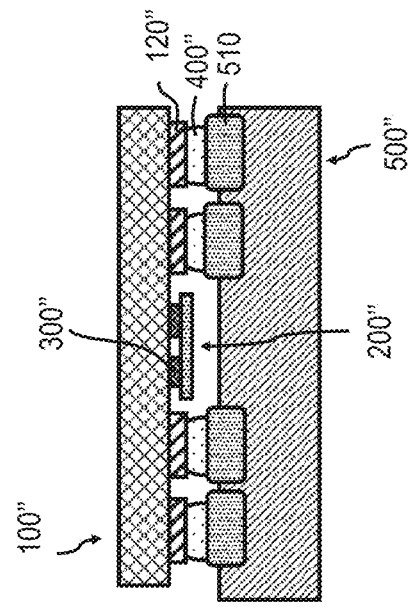
FIG. 4A shows a sectional view of a flip chip die and a capacitor attached to a substrate, in accordance with another illustrative embodiment of the invention.
Figure 4B:
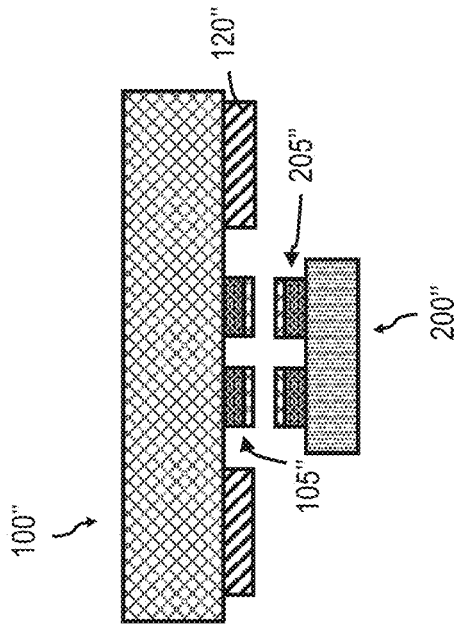
FIG. 4B shows a magnified sectional view of a region of the FIG. 4A flip chip die and capacitor before capacitor attachment.

FIGS. 4A and 4B show a flip chip die 100' and a capacitor 200' attached to a substrate 500' in accordance with another illustrative embodiment of the invention. FIG. 4A shows a sectional view of the flip chip die 100' and the capacitor 200' attached to the substrate 500' along a cleave plane like the A-A' cleave plane in FIG. 1, and FIG. 4B shows a magnified sectional view of a region of the flip chip die 100' and the capacitor 200' just before capacitor attachment.

In the alternative embodiment shown in FIGS. 4A and 4B, the flip chip die 100' and the capacitor 200' utilize different capacitor-to-die interconnects 300' from those presented earlier, while the die-to-substrate interconnects 400' and the associated die pads 120' and substrate pads 505' remain largely identical. More particularly, instead of using capacitor stacks and die stacks in the manner of the capacitor 200 and the flip chip die 100, the capacitor 200' is attached to the flip chip die 100' by preparing capacitor metallic features 220 on the capacitor and die metallic features 125 on the flip chip die 100', and then merging these metallic features 125, 220 together to create the capacitor-to-die interconnects 300'. Reference to FIG. 4B will show that each of the capacitor metallic features 220 is disposed in a capacitor oxide layer 225 on the capacitor 200', and each of the die metallic features 125 is disposed in a die oxide layer 130 on the flip chip die 100'. If the die and capacitor metallic features 125, 220 comprise Cu, for example, they will merge when brought together and heated to about 200° C., creating the capacitor-to-die interconnects 300'. So formed, the capacitor-to-die interconnects 300' will display melting point temperatures over 1,000° C. Thus, the aforementioned temperature delta is quite large using the metallic features 125, 220 for the capacitor-to-die interconnects 300'.

To achieve the combination shown in FIGS. 4A and 4B, steps 1005-1015 in the method 1000 are modified from those discussed above, while steps 1020-1030 remain largely the same. In one or more embodiments, for example, formation of both the die metallic features 125 and the capacitor metallic features 220 in steps 1005 and 1010 may be performed by damascene processes. For the capacitor 200', the capacitor oxide layer 225 may be formed on the capacitor 200', and then trenches etched into the capacitor oxide layer 225 where the capacitor metallic features 220 are desired utilizing photolithography and anisotropic etching. Subsequently a blanket layer of metal (e.g., Cu) may be deposited on the capacitor oxide layer 225 and planarized by chemical mechanical planarization (CMP) so that the metal only remains in the trenches. A similar damascene process may be performed to form the die metallic features 125 in the die oxide layer 130. The die and capacitor metallic features 125, 220 may then brought together and heated to join the capacitor 200' to the flip chip die 100' (still part of a wafer) in step 1015.

Figure 5A:
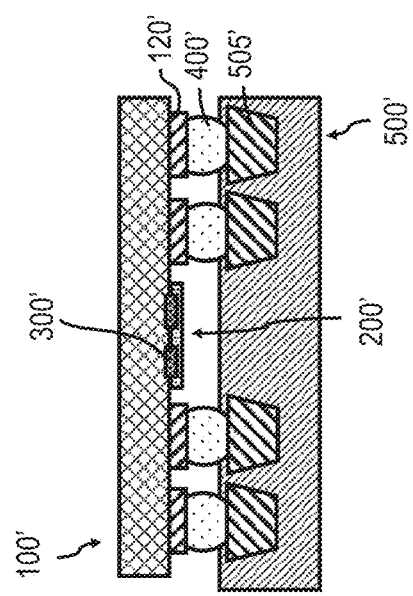
FIG. 5A shows a sectional view of a flip chip die and a capacitor attached to a substrate, in accordance with even another illustrative embodiment of the invention.
Figure 5B:
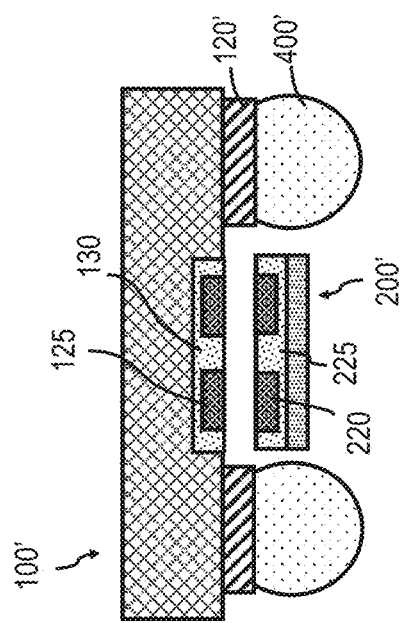
FIG. 5B shows a magnified sectional view of a region of the FIG. 5A flip chip die and capacitor just before capacitor attachment.

FIGS. 5A and 5B show a flip chip die 100" and a capacitor 200" attached to a substrate 500" in accordance with even another illustrative embodiment of the invention. FIG. 5A shows a sectional view of the flip chip die 100" and the capacitor 200" attached to the substrate 500" along a cleave plane like the A-A' cleave plane in FIG. 1, and FIG. 5B shows a magnified sectional view of a region of the flip chip die 100" and the capacitor 200" just before capacitor attachment. Notably, in a manner different from that set forth above, the substrate 500" utilizes raised substrate studs 510 to interconnect with the flip chip die 100" (FIG. 5A). That is, the substrate 500" does not include substrate pads like the substrate pads 505, 505' in FIGS. 2A and 4A.

In steps 1005 and 1010, the flip chip die 100" and the capacitor 200" are prepared for interconnection by forming die stacks 105" and capacitor stacks 205" similar to the die stacks 105 and the capacitor stacks 205, respectively, set forth above. Die pads 120" are also formed on the flip chip die 100". Formation of the die pads 120" may be by, for example, depositing a blanket UBM layer and then patterning that layer by photolithography and anisotropic etching. In a departure from the previous embodiments, no die-to-substrate interconnects (i.e., solder bumps) are formed in step 1005.

Subsequently, steps 1015 (joining the capacitor 200" to the flip chip die 100" (still part of a wafer)) and step 1020 (wafer dicing) are performed in the manner set forth above. However, in step 1025, the substrate is prepared with substrate studs 510 topped with pre-solder, which will ultimately become the die-to-substrate interconnects 400". The substrate studs 510 and pre-solder on the substrate 500" may be formed by, for example, coating the substrate 500" in resist, and then exposing and developing the resist to create openings in the resist over those regions where the substrate studs 510 are intended. Electroplating may then be utilized to form the substrate studs 510. The resist may then be removed and the shorting electroless metal (e.g., Cu) layer etched away. Next a permanent solder resist may be applied, and then exposed and developed to create openings in the solder resist over the substrate studs 510. At this point, solder may be either screened on or solder ball drop used to apply solder in these regions. Instead of using only pre-solder, ball standoffs may also be utilized to form the die-to-substrate interconnects 400" on the substrate studs 510. In this way, standoff heights of as much as 100 µm can be achieved.

The substrate studs 510 may comprise, for example, Cu, and the pre-solder layers may comprise any suitable solder, including, for example, low melting solders such as SnBi-based solder, In-based solder, eutectic PbSn, or various combinations of Pb-free solder, etc. In step 1030, die attach may be performed by bringing the pre-solder layers on the substrate studs 510 into contact with the die pads 120" on the flip chip die 100", and heating to reflow the pre-solder to form the die-to-substrate interconnects 400". As before, a layer of flux may be applied before die attach or an atmosphere of formic acid may be utilized in step 1030 to aid with cleaning, promoting wetting, and reducing oxidation during die attach.

Figure 6:
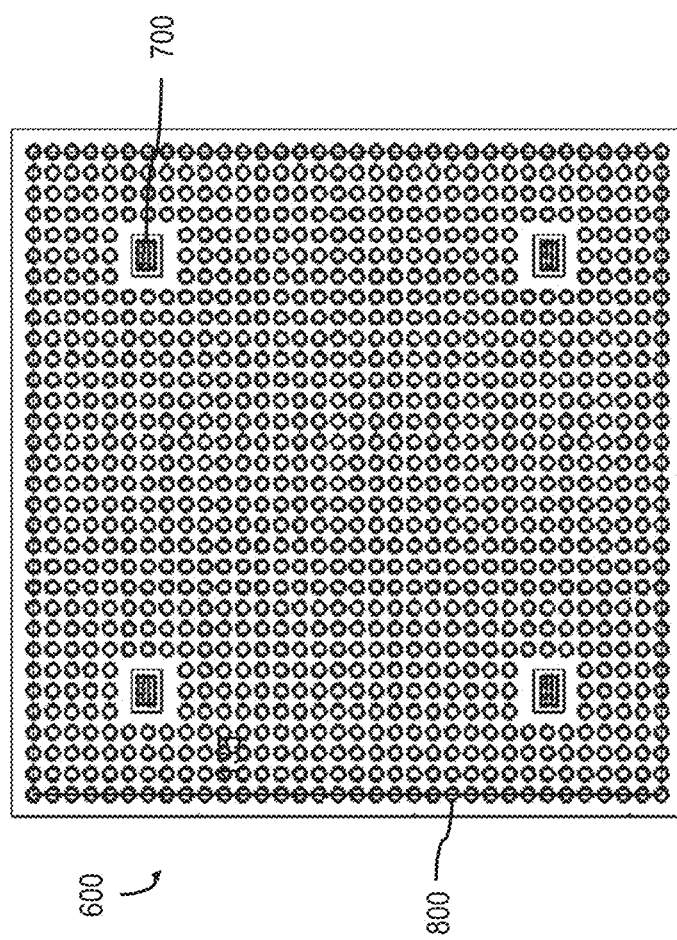
FIG. 6 shows a bottom elevational view of multiple capacitors joined to a flip chip die, in accordance with another illustrative embodiment of the invention.

While attachment of a single capacitor to the bottom of a flip chip die is described in each of the embodiments above, multiple capacitors may be attached to the underside of a given flip chip die when aspects of the invention are reduced to practice. FIG. 6 shows a bottom elevational view of a flip chip die 600 with four capacitors 700 attached to its underside before die attach, in accordance with an illustrative embodiment of the invention. The flip chip die 600 includes a plurality of die-to-substrate interconnects 800, which, in the present embodiment, are in the form of solder bumps. The ideal location for each capacitor is typically adjacent to the high power core.

It should again be emphasized that the above-described embodiments of the invention are intended to be illustrative only. Other embodiments may, for example, utilize different materials and configurations from those expressly set forth above to achieve embodiments falling within the scope of the invention. These numerous alternative embodiments within the scope of the appended claims will be apparent to one skilled in the art. For example, while several means of interconnection between capacitors, flip chip dies, and substrates are discussed above, other equally suitable means of interconnection would also fall within the scope of the invention.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit package, the method comprising the steps of:
    attaching a capacitor to a flip chip die via a plurality of capacitor-to-die interconnects by bringing a capacitor metallic feature into contact with a die metallic feature and heating the capacitor metallic feature and the die metallic feature;
    attaching the flip chip die to a substrate via a plurality of die-to-substrate interconnects connected to a plurality of die pads on the die by heating the die-to-substrate interconnects;
    wherein the capacitor occupies a region between the flip chip die and the substrate;
    further comprising avoiding interference of the capacitor with the substrate by sizing each of the plurality of the capacitor-to-die interconnects to have a height smaller than that of each of the plurality of die-to-substrate interconnects; and by sizing a combined height of the capacitor and the capacitor-to-die interconnects to be smaller than a combined height of the die pads and the die-to-substrate interconnects;
    wherein the capacitor metallic feature is disposed in a first oxide layer that covers a surface of the capacitor facing the flip chip die and is interposed between the capacitor and the flip chip die;
    the die metallic feature is disposed in a second oxide layer that is formed in the flip chip die; and
    surfaces of the die metallic feature, the second oxide layer, and the flip chip die that face the capacitor are coplanar.

2. The method of claim 1, wherein the step of attaching the flip chip die to the substrate comprises heating the flip chip die and the substrate to a maximum temperature below a melting point temperature of the plurality of capacitor-to-die interconnects.

3. The method of claim 1, wherein:
    the capacitor metallic feature comprises tin; and
    the die metallic feature comprises gold.

4. The method of claim 1, wherein:
    the capacitor metallic feature comprises tin and silver; and
    the die metallic feature comprises tin and silver.

5. The method of claim 1, wherein:
    the capacitor metallic feature comprises copper; and
    the die metallic feature comprises copper.

6. The method of claim 1, wherein the step of attaching the capacitor to the flip chip die is performed while the flip chip die constitutes part of a larger intact wafer comprising a plurality of flip chip dies including the flip chip die; further comprising dicing the wafer containing the flip chip die to create individual flip chip dies, including the flip chip die.

7. The method of claim 1, wherein the step of attaching the flip chip die to the substrate comprises reflowing a plurality of solder bumps.

8. The method of claim 1, wherein the plurality of die-to-substrate interconnects comprise SnBi-based, In-based, and/or PbSn-based solder.

* * * * *